United States Patent [19]

Thomson et al.

[11] Patent Number: 5,721,502
[45] Date of Patent: Feb. 24, 1998

[54] VOLTAGE-CONTROLLED RESET FOR LOGIC STATE INITIALIZATION

[75] Inventors: David Thomson, Fremont; Evaldo M. Miranda, San Jose, both of Calif.

[73] Assignee: Analog Devices, Inc., Norwood, Mass.

[21] Appl. No.: 810,133

[22] Filed: Feb. 25, 1997

Related U.S. Application Data

[63] Continuation of Ser. No. 690,260, Jul. 24, 1996, abandoned, which is a continuation of Ser. No. 469,435, Jun. 6, 1995, abandoned.

[51] Int. Cl.$^6$ ............................. H03L 7/00; H03K 3/02
[52] U.S. Cl. ............................. 327/143; 327/198
[58] Field of Search .................. 327/142, 143, 327/198, 77–81

[56] References Cited

U.S. PATENT DOCUMENTS

| | | | |
|---|---|---|---|
| 4,551,841 | 11/1985 | Fujita et al. | 327/143 |
| 4,560,889 | 12/1985 | Hayashi | 327/143 |
| 5,103,115 | 4/1992 | Ueda et al. | 327/143 |
| 5,243,233 | 9/1993 | Cliff | 327/143 |

FOREIGN PATENT DOCUMENTS

| | | | |
|---|---|---|---|
| 53-145550 | 12/1978 | Japan | 327/198 |
| 54-154365 | 12/1979 | Japan | 327/143 |
| 4117717 | 4/1992 | Japan | 327/143 |
| 5206812 | 8/1993 | Japan | 327/143 |
| 6097796 | 4/1994 | Japan | 327/143 |

OTHER PUBLICATIONS

Phillip E. Allen, Douglas R. Holberg, *CMOS Analog Circuit Design*, Holt Rhinehart and Winston, Inc., New York, 1987, pp. 95–124.

Paul Horowitz, Winfield Hill, *The Art of Electronics*, Second Edition, Cambridge University Press, New York, 1980, p. 328.

H. E. Lin, *Electronics Designers' Handbook*, Robert W. Landee, Donovan C. Davis, Albert P. Albrecht editors, Second Edition, McGraw-Hill Book Company, 1977, pp. 11–24.

*Primary Examiner*—Toan Tran
*Attorney, Agent, or Firm*—Koppel & Jacobs

[57] ABSTRACT

A voltage divider and inverter provide a power-on-reset signal. The divider is placed between high and low power voltages, the divided voltage is the input to the inverter and the output of the inverter is the power-on-reset signal. The divider and inverter may be implemented on a single integrated circuit and accompany other, control and operational, circuitry on the integrated circuit. The divider is chosen so that the input to the inverter reaches the inverter's threshold voltage when the power voltage reaches a predetermined value.

14 Claims, 4 Drawing Sheets

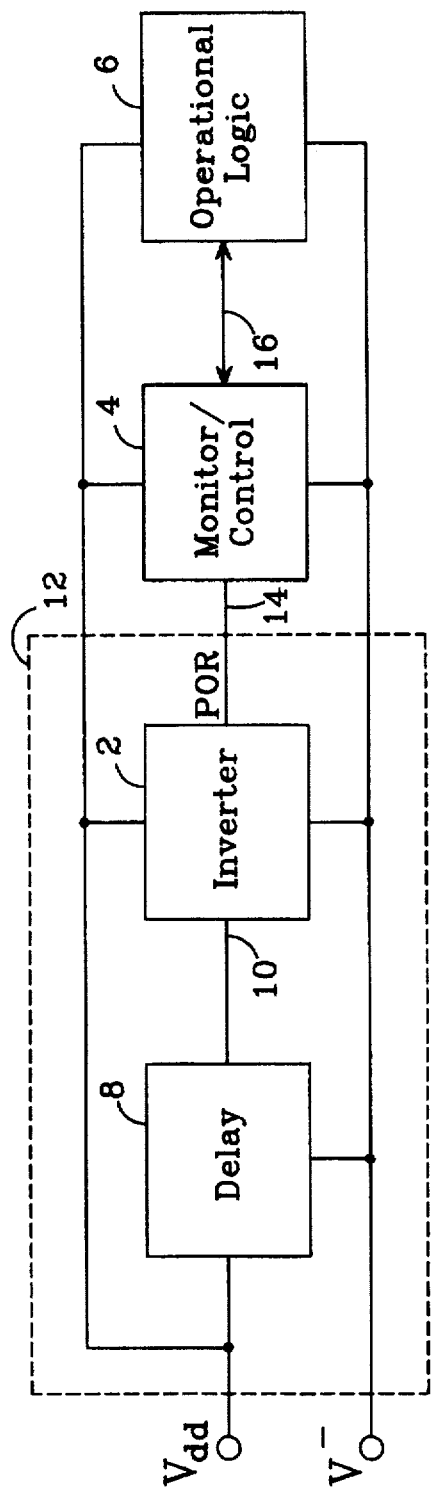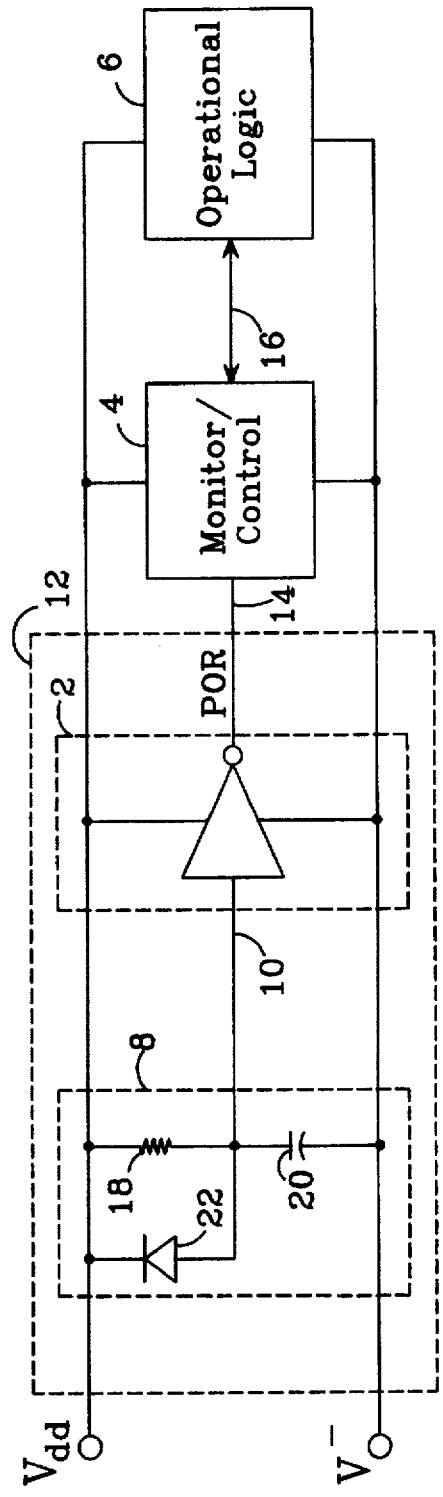

VOLTAGE-CONTROLLED RESET FOR LOGIC STATE INITIALIZATION

This is a continuation of application Ser. No. 08/690,260, filed on Jul. 24, 1996, now abandoned, which is a continuation of application Ser. No. 08/469,435, filed on Jun. 6, 1995, abandoned.

BACKGROUND OF THE INVENTION

1. Field of the Invention

This invention is related to the provision of a power-on-reset (POR) signal for electronic circuits.

2. Description of the Related Art

Power is supplied to electronic systems in a gradual fashion for a number of reasons, e.g., the need to limit in-rush currents, limits on power availability, etc. During the time that power gradually "ramps up", circuitry may toggle somewhat randomly, leaving an entire system in an unknown state when power has been fully supplied to a system. Further, the rate at which power is supplied varies from system to system.

POR signals are used to ensure that an electronic circuit does not begin operation until the power supply voltage reaches a level that permits proper operation. All digital circuitry, from the lowest level of integration, such as the "glue" logic required to provide an interface between complex digital systems, to the highest levels of integration exemplified by the most complex microprocessors available, requires an "all clear" signal that indicates to the circuitry when operation may safely commence. Without such a signal the somewhat random, and totally meaningless, toggling of digital circuitry during the time that power is gradually applied to the system could be interpreted as meaningful data or instructions, with possibly catastrophic consequences.

FIG. 1 illustrates one known approach to creating a POR signal. Power is supplied to the system of FIG. 1 through positive voltage input terminal Vdd and returned through negative voltage terminal V⁻, which is typically ground. Power is distributed to inverter 2, monitor/control 4 and operational logic 6 blocks.

A delay block 8 accepts the positive input voltage Vdd and passes a delayed voltage signal to the input terminal 10 of the inverter 2. The inverter 2 outputs an active low POR signal. The delay block 8 together with the inverter 2 constitutes a POR circuit 12 which, in many cases, is packaged separately from the monitor/control block 8 which accepts the POR signal at its input terminal 14. The monitor/ control block 8 uses the POR signal to control, through its interface 16, the operational logic block 6. This block includes digital logic circuitry with input and output ports which are controlled by some form of enabling signal. For example, if the operational block includes integrated circuit (IC) memory, the enabling signals would include, "Chip Select", "Read" and "Write". The operational circuitry may also include analog and mixed analog/digital circuitry.

FIG. 2 illustrates the POR circuit 12 in greater detail. The delay block 8 comprises a resistor 18 connected between $V_{dd}$ and the inverter's input 10 and a capacitor 20 that is connected between the input of inverter 2 and ground. As the power supply voltage increases, the center voltage of the resistor/ capacitor (RC) network 18/20 follows it. Once the RC center voltage reaches the input threshold voltage of the inverter, the inverter's output goes low, thus providing an active low indication that the power supply voltage has reached a level which is acceptable for normal circuit operation. Typically, the resistor 18 and capacitor 20 are discrete components connected to the power supply $V_{dd}$, inverter input 10 and ground through printed circuit traces.

In fact, this circuit provides the POR only indirectly. The voltage at the input 10 of inverter 2 does not directly track the power supply voltage. That is, the voltage at the input 10 is not an instantaneous fixed ratio of the power supply voltage; rather it is a delayed version of it. The voltage at the inverter input 10 depends upon the RC time constant, but not directly upon the input voltage. At some RC time constant after $V_{dd}$ passes the inverter's input threshold, the inverter's input voltage reaches an acceptable trigger level. If the capacitor 20 is too small, the input voltage could reach the threshold of inverter 2 before the power supply voltage has reached an adequate level. Because it is important to be sure that the power supply voltage has reached its minimum acceptable level before commencing operation, the capacitor 20 is often chosen to be quite large.

One problem associated with using a large capacitor is that the power-on-reset circuitry must respond to disturbances to the power supply that, although brief, may be of sufficient magnitude to upset and invalidate the logic states of the circuitry. To accommodate these limited duration power supply disturbances, a diode 22 is added across the resistor 18 so that it is reverse-biased during normal operation, but rapidly drains the capacitor 20 whenever the power supply voltage falls below the voltage of capacitor 20.

Even with the addition of the diode, however, the selection of capacitor 20 presents a compromise between a capacitor that is large enough to assure a valid POR signal for a very gradual initial application of power, and one that is small enough to respond to relatively brief power disturbances.

Furthermore, it is important to minimize the number of components employed in any electronics design. Every additional component adds to the cost of components, to the cost of manufacturing, and to the cost of testing. Additionally, the area occupied by components should be kept to a minimum. Every additional component reduces a system's reliability, not only due to the possibility of component failure, but also due to the increased number of solder joints and interconnection paths.

A reduced component count can improve system reliability in another way. If, for example, the entire POR block 12, the monitor/control block 8 and the operational block 6 were formed on a single IC, the number of pins used to connect the circuitry to the exterior of the IC could be reduced. Reducing pin (or pad, or ball, depending upon package type) count in this manner eliminates a wire bond between the IC and the circuit's package, and also eliminates a solder connection to the printed circuit board (or other substrate) to which the circuit is attached. Additionally, if the IC's package is a "standard" package (e.g., sixteen pin DIP) every pin eliminated from the POR function may be used for other applications.

Because it is impractical to integrate large capacitors into integrated circuit, and because the rate at which power is applied to a system varies widely from application to application, this prior art circuit requires the use of external components, with all the cost and reliability problems that ensue.

For the forgoing reasons, there is a need for a POR indicator that eliminates external components, improves reliability and reduces cost while still assuring valid power on reset signals and responding to brief power disturbances.

SUMMARY OF THE INVENTION

The invention seeks to provide POR circuitry which produces a reliable indication that a power supply voltage has reached a safe operating level. It seeks to achieve this end while improving reliability, reducing cost and reducing the volume of the required circuitry.

The invention comprises an inverter with a voltage-divider between the power supply terminals to provide the input to the inverter. In addition, a pull-up resistor on the inverter output provides the proper output voltage during the initial segment of the power-up transition period. Because all the POR components may be located on the same IC, their values may be selected with precision and may reflect process-specific characteristics such as the n-channel and p-channel gate thresholds of the inverter. As a result, the power supply voltage at which the power on reset is asserted may be set with equal precision.

In various embodiments, the invention includes monitor/control and operational circuitry that are located on the same IC as the POR circuitry. For example, in one embodiment the POR circuitry is located on the same IC as a watchdog circuit and a microprocessor. In another embodiment, the POR circuitry is located on the same IC as the monitor/control circuitry and an analog-to-digital converter (A/D).

The invention also comprises a method for producing a POR signal that includes dividing a power supply voltage, and logically inverting the divided voltage. The resistor values for the resistive are selected by first selecting the value of input power voltage at which the POR signal indicates operation may commence. This value should be greater than the total of the n-channel gate threshold and the magnitude of the p-channel gate threshold, but it should be low enough so that, during normal operation, power supply excursions below the minimum specified operating voltage initiates a POR. This input power voltage is then related to the threshold voltage of the inverter. Finally, the voltage divider resistors are selected so that the input to the inverter equals the inverter threshold voltage when the power supply input equals the value chosen in step one.

BRIEF DESCRIPTION OF THE DRAWINGS

FIG. 1 is a block diagram for a prior art POR circuit and related circuitry.

FIG. 2 is a schematic diagram of the prior art circuit shown in FIG. 1.

DETAILED DESCRIPTION OF THE INVENTION

Figure 3:
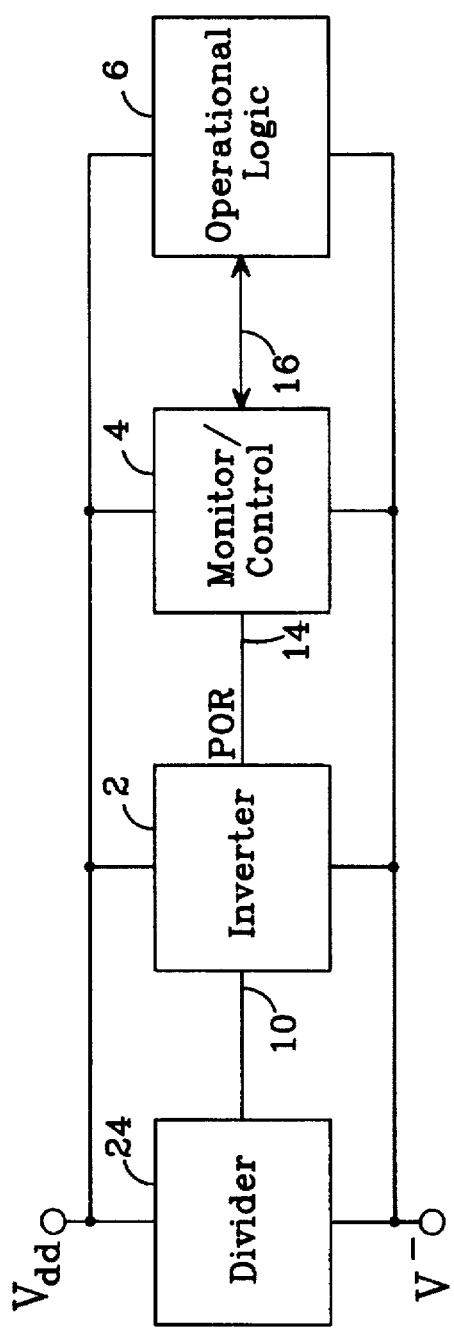
FIG. 3 is a block diagram of one embodiment of the invention.

Referring to FIG. 3, the invention employs an inverter 2, monitor/control block 8 and operational block 6 that can be the same as in FIGS. 1 and 2. However, instead of the delay circuit employed in the prior designs, the invention connects a voltage divider 24 between the input terminals $V_{dd}$ and $V^-$. A divided voltage output is provided to the inverter input 10.

The input threshold of the inverter 2 is a function of gate oxide capacitance per unit area, n- and p-channel mobilities, n- and p-channel lengths and n-and p-channel widths (for a CMOS inverter). The values of each of these parameters may change with each manufacturing "run" and, consequently, the input threshold of the inverter 2 will change correspondingly. The input threshold of the inverter 2 is also a function of $V_{dd}$ and the rate at which $V_{dd}$ is applied to the system will vary from application to application. Moreover, the minimum safe operating value for $V_{dd}$ will also vary from application to application, depending upon the maximum number of inputs to any logic gate within the design. By using a resistive voltage divider that is based upon the parameter values of a specific manufacturing run, the voltage divider may set the inverter input to be equal to the threshold of the inverter at the precise time that $V_{dd}$ is equal to a desired, safe, operating voltage. Without this precise selection of the resistors in the divider, the divider may set the input voltage to the inverter equal to the threshold voltage of the inverter at a time when the power supply voltage $V_{dd}$ is too low for normal operation. Additionally, absent this precision, the divider may set the input voltage equal to the threshold of the inverter only when the power supply $V_{dd}$ reaches a level which is higher than the maximum specified operating voltage for the circuit; the POR signal will never "release" the circuitry, even when $V_{dd}$ reaches the circuit's nominal operating voltage.

Figure 4:
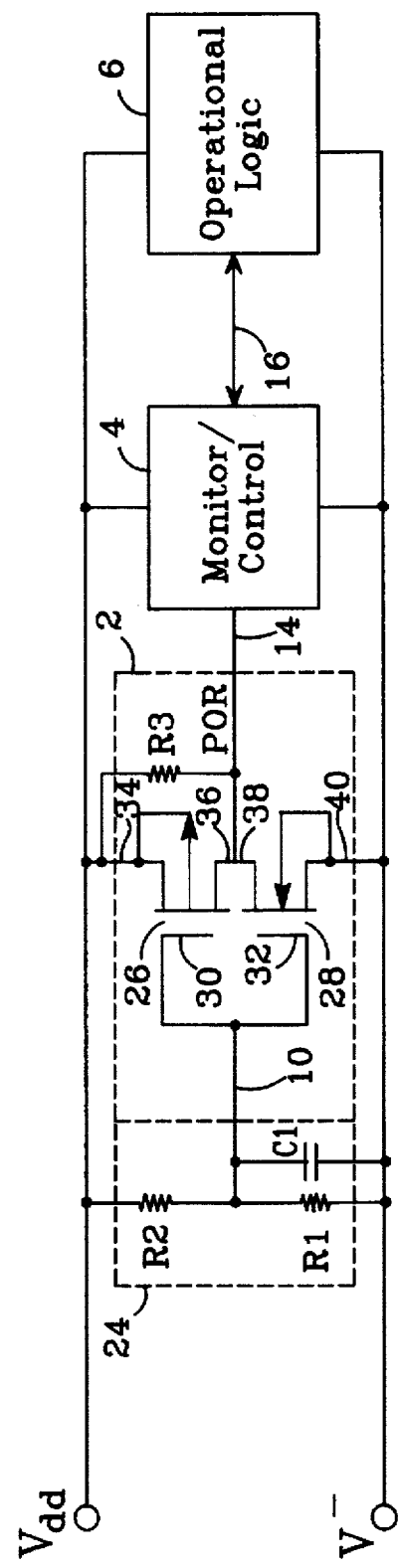
FIG. 4 is a schematic diagram of the circuit shown in FIG. 3.

FIG. 4 shows a preferred implementation for the divider 24 and inverter 2. The inverter uses a CMOS design with a p-channel FET 26 and an n-channel FET 28 whose respective gates 30 and 32 are connected to one another and to the inverter's input terminal 10. The FET source-drain circuits are connected in series, with the source 34 of the p-channel FET 26 connected to $V_{dd}$, their drains 36 and 38 connected to one another, and the source 40 of the n-channel FET 28 connected to $V^-$. The voltage divider 24 consists of resistors $R_1$ and $R_2$ connected in series between $V^-$ and $V_{dd}$, with a capacitor C1 connected across R1 to obtain a slower voltage rise time. The capacitor is preferably small enough to be implemented on-chip; a suitable value is 10 pF. The input 10 to the inverter 2 is taken from the junction of $R_1$ and $R_2$. A resistor $R_3$ that is connected between the $V_{dd}$ and the inverter's output pulls the inverter's output signal POR to the level of the power supply input $V_{dd}$ during an initial period of the power up cycle when the FET 26 is off.

During normal operation, i.e. with $V_{dd}$ equal to its nominal operating value, a high level input will turn the p-channel FET 26 off and the n-channel FET 28 on. In this case, the n-channel FET 28 will pull the inverter output POR low. Conversely, a low input will turn the p-channel FET 26 on and the n-channel FET 28 off; the p-channel FET 26 will pull POR high. However, predicting the inverter's 6 operation during a power-up transition is less straightforward. During the initial stage of power-up neither FET 26 nor 28 is on, and the resistor $R_3$ pulls POR to the level of $V_{dd}$. As $V_{dd}$ increases, the voltage at the inverter input 10 (with the proper selection of resistors $R_1$ and $R_2$), will reach the inverter's threshold voltage, and POR will switch from a logic high to a logic low simultaneously with $V_{dd}$ reaching a predetermined level. The task of selecting the values of resistors $R_1$ and $R_2$ is complicated by the fact that the inverter's input threshold voltage increases with increasing $V_{dd}$.

Figure 5:
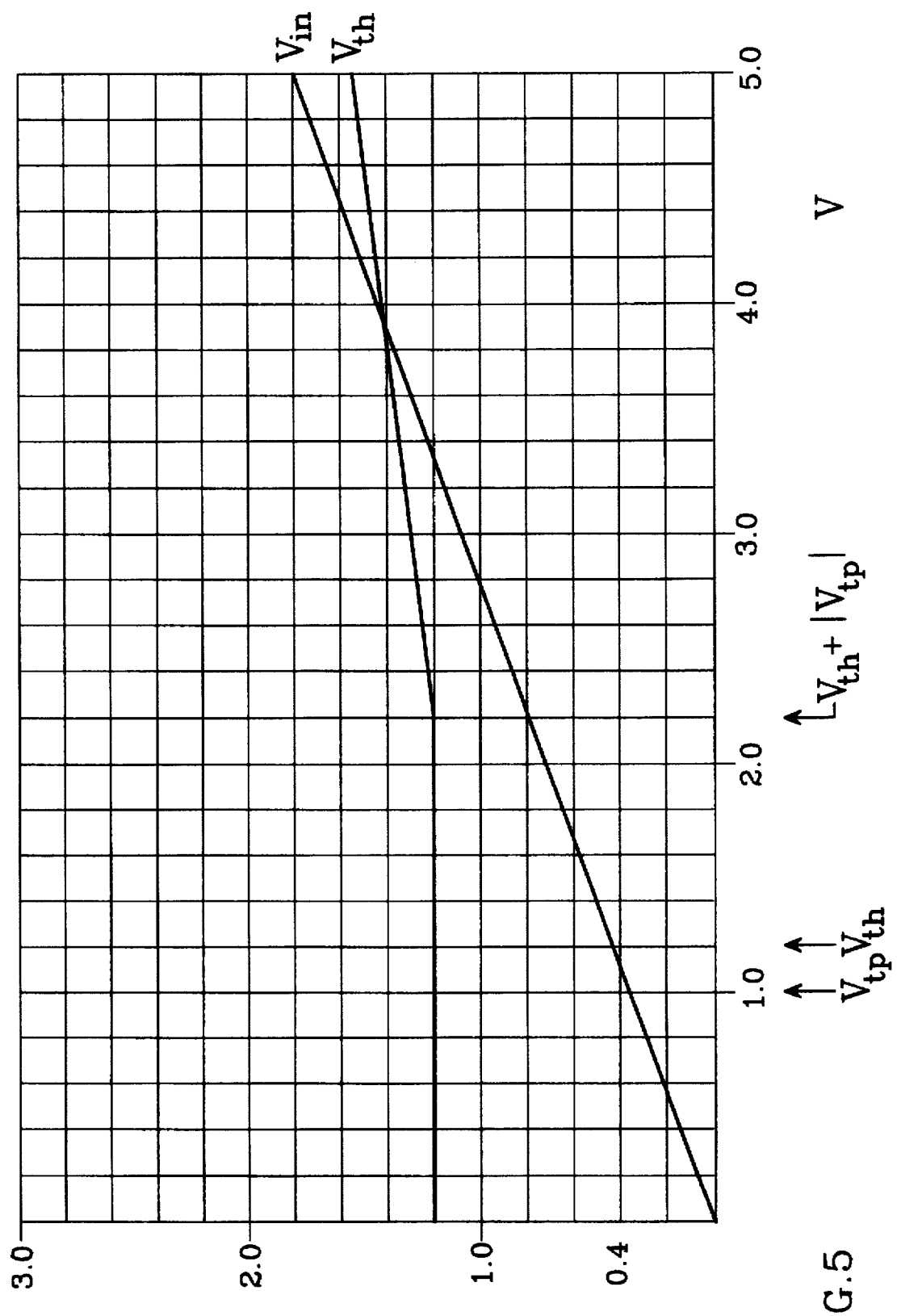
FIG. 5 is a graph of the inverter threshold voltage versus power supply voltage for an exemplary divider and inverter.

FIG. 5 plots the inverter's input threshold voltage $V_{th}$ as a function of $V_{dd}$. When $V_{dd} > V_{tn} + |V_{tp}|$ ($V_{tn}$ and $V_{tp}$ are, respectively, the n-channel and p-channel threshold voltages), both the n-channel FET 28 and the p-channel FET 26 are saturated when the inverter's input voltage equals its output voltage (i.e. when the inverter is switching) and the drain to source voltage, $V_{ds}>V_{gs}-V_t$ ($V_{gs}$ is the gate-to-source voltage and $V_t$ the FET threshold voltage) for both FETs 26 and 28. In this region, $V_{th}$ may be determined from the drain current equations (see Phillip E. Allen, Douglas R. Holberg, *CMOS Analog Circuit Design*, Holt, Rhinehart and Winston, Inc., New York, 1987, pages 95–121):

$$I_{dn}=\beta_n/2(V_{in}-V_m)^2, \; I_{dp}=\beta_p/2(V_{dd}-V_{in}+V_{tp})^2$$

where:

$I_{dn}$ is the n-channel FET 28 drain current $I_{dp}$ is the p-channel FET 26 drain current $V_{in}$ is the inverter input voltage $V_m$ is the n-channel FET 28 threshold voltage $V_{tp}$ is the n-channel FET 28 threshold voltage and $\beta_n=(\mu_n)(C_{ox})(W_n/L_n)$ $\beta_p=(\mu_p)(C_{ox})(W_p/L_p)$ where:

$\mu_n$ and $\mu_p$ are the n-channel FET 28 and p-channel FET 26 mobilities, $W_n$ and $W_p$ are the n-channel FET 28 and p-channel FET 26 channel widths, $L_n$ and $L_p$ are the n-channel FET 28 and p-channel FET 26 channel lengths, and $C_{ox}$ is the capacitance per unit area of gate oxide.

When the inverter input 10 reaches the inverter's threshold voltage, both the n-channel FET 28 an p-channel FET 26 will be saturated and their drain currents will be equal. Equating the drain currents, one obtains:

$$(\beta_n/2)(V_{in}-V_m)^2=(\beta_p/2)(V_{dd}-V_{in}+V_{tp})^2$$

The inverter's input threshold voltage, $V_{th}$, is plotted as a function of $V_{dd}$ for one set of process values ($W_n$, $L_n$, $C_{ox}$, etc.) in FIG. 5. When $V_{dd}$ is greater than $V_{th}+|V_{tp}|$, the threshold voltage $V_{th}$ is well defined and is given by:

$$V_{th}=(V_m\sqrt{\beta n}+\sqrt{\beta p}\;V_{dd}+\sqrt{\beta p}\;V_{tp})/(\sqrt{\beta n}+\sqrt{\beta p})$$

Because the threshold voltage, $V_{th}$, is well-defined in this region, it is desirable to force the inverter's input voltage to be equal to the inverter's threshold voltage at some point in this region.

The POR trigger voltage (the value of $V_{dd}$ at which the POR signal is asserted) should be greater than the minimum level of $V_{dd}$ required for proper circuit operation. At the system level this may be a widely used specified voltage, such as 5 V or 3 V, that is employed by a standard logic family. At the IC level, this minimum voltage may be determined from the "depth" of gates in the circuitry for which the POR is provided. As a first approximation, the $V_{dd}$ trigger voltage should be at least $V_{tn}+|V_{tp}|$, corresponding to the threshold voltage for a CMOS inverter. A two input NAND gate will require a slightly higher minimum trigger voltage due to the reverse bias between the IC body and the n-channel FET which is connected in series between the NAND output and the other n-channel FET that comprises the NAND gate. The FET threshold voltages $V_m$ and $V_{tp}$ are usually in the range of 1 V±0.2 V. The supply voltage $V_{dd}$ will, in response to temporary load increases, fall below the nominal voltage. However, because one doesn't want every minor drop in $V_{dd}$ to assert the POR signal, the trigger voltage should be set below the nominal supply voltage.

Once a POR trigger voltage is chosen in this fashion, the resistors $R_1$ and $R_2$ are chosen, using the relationship:

$$V_{in}=V_{dd}(R_1)/(R_1+R_2)$$

so that $V_{in}$ equals the inverter's threshold voltage $V_{th}$ when $V_{dd}$ equals the POR trigger voltage.

For $V_{dd}<V_{tn}+|V_{tp}|$ the p-channel FET 26 will not be able to pull the output POR up. The resistor $R_3$ holds the output POR high until the input voltage, $V_{in}$, reaches the inverter threshold $V_{th}$, at which point the n-channel FET 28 turns on and pulls POR low. The resistor $R_3$ is chosen to be relatively large to minimize operating current and to ensure that the n-channel FET 28 can pull POR to a logic low level.

$V_{in}$ is plotted in FIG. 5 for $R_1$=550k and $R_2$=300k. In this example, $V_{tn}$=1.2 V, $V_{tp}$=1.0V $\beta_n$=3.51×10$^{-4}$ and $\beta_p$=6.26×10$^{-6}$.

Figure 6:
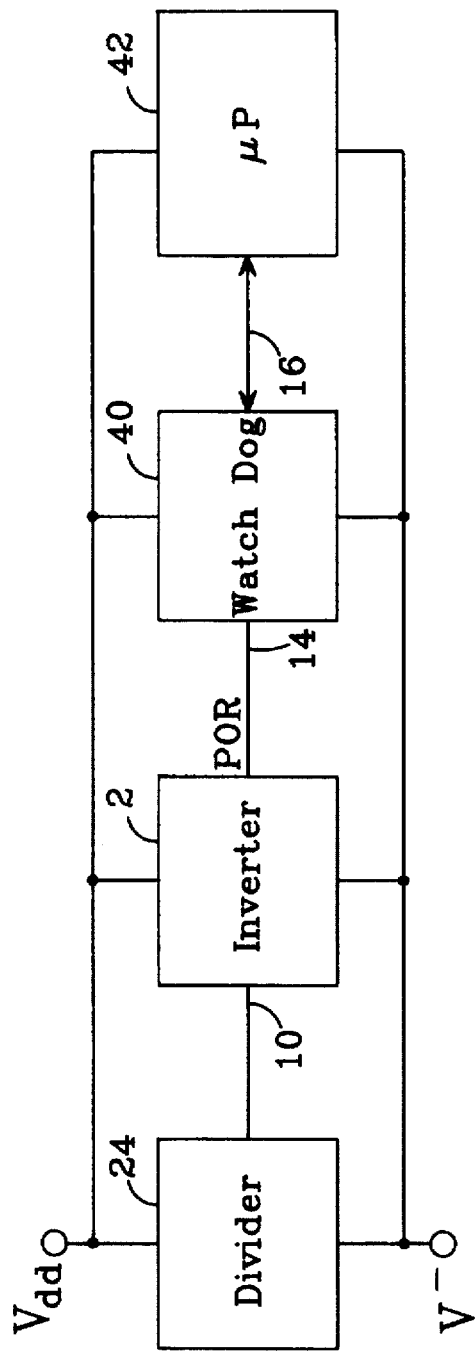
FIG. 6 is a block diagram of the POR circuit incorporated with a watchdog circuit on a single IC.

FIG. 6 is a block diagram of one embodiment of the invention in which the monitor/control circuitry 8 is a conventional "watchdog" circuit 40 and the operational circuit 10 is a microprocessor 42. All the functional blocks, divider 24, inverter 2, monitor/control 4 and operational 42, may be incorporated in a single IC.

The watchdog 40 monitors the operation of the microprocessor 42 by requiring that the microprocessor periodically assert, through the interface 16, a control bit in the watchdog 40. If the microprocessor fails to assert the bit, due to hardware or software failure, within a prescribed period of time, the watchdog 40 sends a reset signal through the interface 16 to the microprocessor 42. For example, the watchdog may comprise a pair of "D" flip-flops with a clock signal connected to them to clock, first through one, and then, from the output of the first through the second, a logical "HIGH". The microprocessor, is required to reset the first "D" flip-flop before its output can be clocked through the second "D" flip-flop.

The watchdog 40 accepts the POR signal at its input 14 and functionally "ORs" it with the operation of the control bit. That is, the watchdog will send a reset signal to the microprocessor 42 if the control bit is not asserted by the microprocessor in the prescribed period of time or if the POR output is activated.

Figure 7:
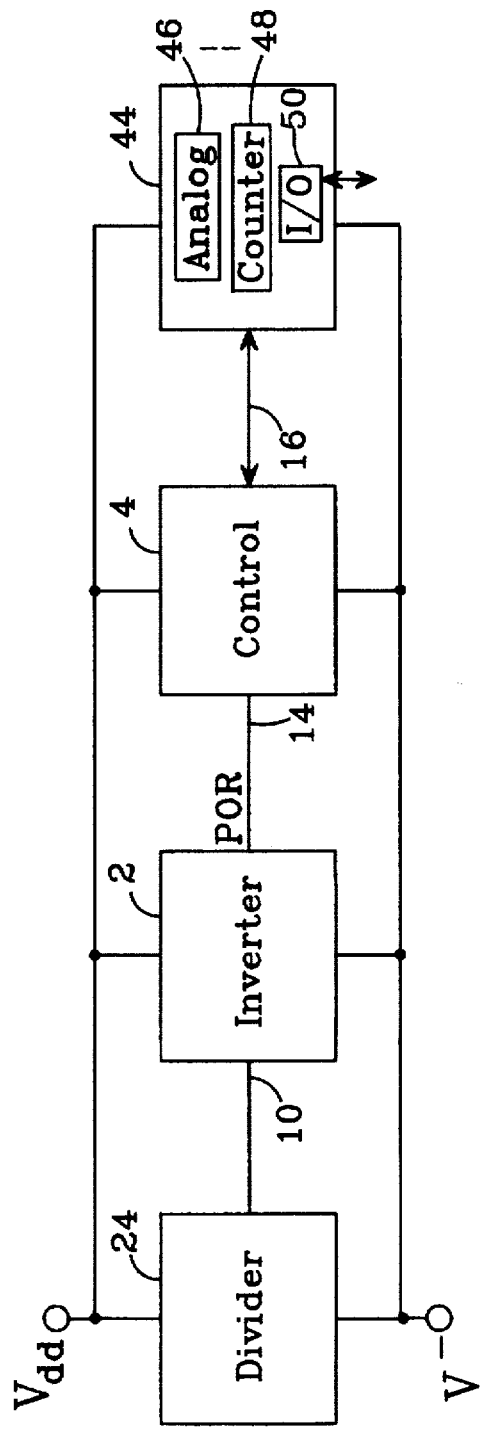
FIG. 7 is a block diagram of the POR circuit incorporated with control circuitry and an A/D.

FIG. 7 is a block diagram of another embodiment of the invention. The divider 24, inverter 2 and monitor/control 4 blocks are combined with a "delta-sigma" analog-to-digital converter (A/D) 44 (see Paul Horowitz, Winfield Hill, *The Art of Electronics*, Cambridge University Press, New York, 1989, Page 328) on a single IC. The A/D 44 comprises an analog section 46, counter 48 and an Input/Output section 50. In operation, an analog signal is applied via the Input/Output section 50 to the analog section 46 where charge pulses are switched, depending upon the input voltage, to a summing junction or to ground. The counter 48 counts the number of pulses switched to the summing junction in a given period of time. The counter 48 output is proportional to the analog voltage being converted. The input/output section 50 also accepts commands and provides status outputs. The monitor/control section 8 employs the POR output to, among other things, disable communication through the input/output section 50 until $V_{dd}$ has reached its trigger voltage. The control section 8 also uses the POR output to reset the counter 48.

The forgoing description of specific embodiments of the invention has been presented for the purposes of illustration and description. It is not intended to be exhaustive or to limit the invention to the precise forms disclosed, and many modifications and variations are possible in the light of the above teachings. The inverter, for example could be an n-channel, p-channel or JFET inverter. The embodiments were chosen and described in order to best explain the principles of the invention and its practical application, to thereby enable others skilled in the art to best utilize the invention. It is intended that the scope of the invention be limited only by the claims appended hereto.

We claim:

1. A power-on-reset circuit, comprising:

high and low power terminals, a divider connected to divide the voltage between the power terminals, and a CMOS logic inverter having a nominal operating voltage, including input and output terminals and comprising an n-channel and a p-channel FET, said inverter having a variable input inverter threshold voltage beyond which it produces a logic LOW output, said inverter connected to invert the divided voltage and said divider connected to monitor a rising voltage appearing across said high and low power terminals and to provide a reset signal for use by other circuitry to initiate operations, said divider providing to the input of said inverter a voltage less than said inverter threshold voltage when the voltage across said high and low power terminals is less than the sum of the threshold voltages of said n-channel and p-channel FETs, and a voltage greater than or equal to said inverter threshold voltage when the voltage across said high and low sower terminals is greater than or equal to said sum of FET threshold voltages but less than said nominal operating voltage.

2. The power-on-reset circuit of claim 1, wherein said divider includes two resistors R1 and R2 connected in series between said high and low power terminals and produces a divided voltage Vdd(R2)/(R1+R2) that is greater than or equal to $\{(Vtn)(\sqrt{\beta n})+(\sqrt{\beta p})(Vdd)+(\sqrt{\beta n})(Vtp)\}/(\sqrt{\beta n}+\sqrt{\beta p})$ when the voltage at the high power terminal is greater than or equal to said sum of FET threshold voltages, where Vtn is said n-channel FET's threshold voltage, Vtp is said p-channel FET's threshold voltage, Vdd is the voltage between said high and low power terminals, $\beta n$ is the product of the n-channel electron mobility, the capacitance per unit area of the n-channel FET's gate oxide, and the channel width to length ratio of the n-channel FET, $\beta p$ is the product of the p-channel electron mobility, the capacitance per unit area of the p-channel FET's gate oxide, and the channel width to length ratio of the p-channel FET.

3. The power on reset circuit of claim 2 further comprising a pull-up resistor connected between said inverter output and said high power terminal to hold the power on reset signal inactive until the voltage across said high and low power terminals reaches a level that is sufficient to permit the p-channel FET of the CMOS inverter to drive the inverter output.

4. An integrated circuit including a power-on-reset circuit, comprising:

high and low power terminals, a divider which divides the voltage between the power terminals, a CMOS logic inverter having a nominal operating voltage which equals that of the integrated circuit, including input and output terminals and comprising an n-channel and a p-channel FET, said inverter having a variable input inverter threshold voltage beyond which it produces a logic LOW output, said inverter connected to invert the divided voltage and said divider connected to monitor a rising voltage appearing across said high and low power terminals and to provide a reset signal for use by other circuitry to initiate operations, said divider providing to the input of said inverter a voltage less than said inverter threshold voltage when the voltage across said high and low power terminals is less than the sum of the threshold voltages of said n-channel and p-channel FETs, and a voltage greater than or equal to said inverter threshold voltage when the voltage across said high and low power terminals voltage is greater than or equal to said sum of FET threshold voltages but less than said nominal operating voltage, a pull-up resistor connected between said inverter output and said high power terminal to hold the power on reset signal inactive until the voltage across said high and low power terminals reaches a level that is sufficient to permit the p-channel FET of the CMOS inverter to drive the inverter output, operational circuitry, and control circuitry connected to receive the output of said inverter and to utilize the inverted voltage to control the operational circuitry.

5. An integrated circuit as in claim 4, wherein the control circuitry comprises a watchdog circuit and the operational circuit comprises a microprocessor and said divider includes two resistors R1 and R2 connected in series between said high and low power terminals and produces a divided voltage Vdd(R2)/(R1+R2) that is greater than or equal to $\{(Vtn)(\sqrt{\beta n})+(\sqrt{\beta p})(Vdd)+(\sqrt{\beta n})(Vtp)\}/(\sqrt{\beta n}+\sqrt{\beta p})$ when the voltage at the high power terminal is greater than or equal to said sum of FET threshold voltages, where Vtn is said n-channel FET's threshold voltage, Vtp is said p-channel FET's threshold voltage, Vdd is the voltage between said high and low power terminals, $\beta n$ is the product of the n-channel electron mobility, the capacitance per unit area of the n-channel FET's gate oxide, and the channel width to length ratio of the n-channel FET, $\beta p$ is the product of the p-channel electron mobility, the capacitance per unit area of the p-channel FET's gate oxide, and the channel width to length ratio of the p-channel FET.

6. An integrated circuit as in claim 4, wherein the operational circuit comprises an analog-to-digital converter.

7. A power-on-reset circuit for providing a reset signal to circuitry which shares a power source with the power-on-reset circuits comprising:

high and low power terminals connected to high and low power terminals of circuitry which shares a power source with the power on reset circuit, a voltage divider connected between said power terminals and having a divided voltage output terminal, a CMOS logic inverter having a nominal operating voltage equal to that of the circuitry which shares said power source and including input and output terminals power source and comprising an n-channel and a p-channel FET, said inverter having a variable input inverter threshold voltage beyond which it produces a logic LOW output, said inverter connected to invert the divided voltage and said divider connected to monitor a rising voltage appearing across said high and low power terminals and to provide a reset signal for use by other circuitry to initiate operations, said divider providing to the input of said inverter a voltage less than said inverter threshold voltage when the voltage across said high and low power terminals is less than the sum of the threshold voltages of said n-channel and p-channel FETs, and a voltage greater than or equal to said inverter threshold voltage when the voltage across said high and low power terminals is greater than or equal to said sum of FET threshold voltages but less than said nominal operating voltage, and a pull-up resistor connected between said inverter output and said high power terminal to hold the power on reset signal inactive until the voltage across said high and low power terminals reaches a level that is sufficient to permit the p-channel FET of the CMOS inverter to drive the inverter output.

8. The power on reset circuit of claim 7, wherein said divider includes two resistors R1 and R2 connected in series between said high and low power terminals and produces a divided voltage Vdd(R2)/(R1+R2) that is greater than or equal to $\{(Vtn)(\sqrt{\beta n})+(\sqrt{\beta p})(Vdd)+(\sqrt{\beta n})(Vtp)\}/(\sqrt{\beta n}+\sqrt{\beta p})$ when the voltage at the high power terminal is greater than or equal to said sum of FET threshold voltages, where Vtn is said n-channel FET's threshold voltage, Vtp is said p-channel FET's threshold voltage, Vdd is the voltage between said high and low power terminals, $\beta n$ is the product of the n-channel electron mobility, the capacitance per unit area of the n-channel FET's gate oxide, and the channel width to length ratio of the n-channel FET, $\beta p$ is the product of the p-channel electron mobility, the capacitance per unit area of the p-channel FET's gate oxide, and the channel width to length ratio of the p-channel FET.

9. An integrated circuit including a power-on-reset circuit for providing a power-on-reset signal to other circuitry integrated within the integrated circuit, comprising:

high and low power terminals, a voltage divider connected between said power terminals and having a divided voltage output terminal, a CMOS logic inverter having a nominal operating voltage and including input and output terminals and comprising an n-channel and a p-channel FET and having a variable input inverter threshold voltage beyond which said inverter produces a logic LOW output, said inverter connected to invert the divided voltage, and said divider connected to monitor a rising voltage appearing across said high and low power terminals and to provide a reset signal for use by other circuitry to initiate operations, said divider providing to the input of said inverter a voltage less than said inverter threshold voltage when the voltage across said high and low power terminals is less than the sum of the threshold voltages of said n-channel and p-channel FETs, and a voltage greater than or equal to said inverter threshold voltage when the voltage across said high and low sower terminals is greater than or equal to said sum of FET threshold voltages but less than said nominal operating voltage is greater than or equal to the sum of the n-channel and p-channel FET threshold voltages, a pull-up resistor connected between said inverter output and said high power terminal to hold the power on reset signal inactive until the voltage across said high and low power terminals reaches a level that is sufficient to permit the p-channel FET of the CMOS inverter to drive the inverter output, control circuitry comprising n-channel and p-channel MOSFETs and having input and output interfaces, the input interface connected to receive the output of the inverter, and operational circuitry having an interface which is connected to the output interface of the control circuitry for controlling the operation of the operational circuitry.

10. The integrated circuit of claim 9, wherein the control circuit comprises a watchdog circuit and the operational circuit comprises a microprocessor.

11. The integrated circuit of claim 9, wherein the operational circuit comprises an analog-to-digital converter.

12. A power-on-reset circuit, comprising:

a CMOS logic inverter having a nominal operating voltage and being connected to receive power from high and low power terminals, said inverter including input and output terminals and comprising an n-channel and a p-channel FET, said inverter having a variable threshold input voltage beyond which it produces a logic LOW output, and an input voltage circuit for said inverter which provides to the input of said inverter a voltage greater than or equal to said threshold voltage when the voltage across said high and low power terminals is greater than or equal to the sum of the p-channel and n-channel FET threshold voltages.

13. The power-on-reset circuit of claim 12, wherein said input voltage circuit produces a voltage that is less than $\{(Vtn)(\sqrt{\beta n})+(\sqrt{\beta p})(Vdd)+(\sqrt{\beta n})(Vtp)\}/(\sqrt{\beta n}+\sqrt{\beta p})$ when the voltage at the high power terminal is less than the sum of said FETs' threshold voltages and is greater than or equal to $\{(Vtn)(\sqrt{\beta n})+(\sqrt{\beta p})(Vdd)+(\sqrt{\beta n})(Vtp)\}/(\sqrt{\beta n}+\sqrt{\beta p})$ when the voltage at the high power terminal is greater than or equal to said sum of FET voltages but less than said nominal operating voltage, where Vtn is said n-channel FET's threshold voltage, Vtp is said p-channel FET's threshold voltage, Vdd is the voltage between said high and low power terminals, $\beta n$ is the product of the n-channel electron mobility, the capacitance per unit area of the n-channel FET's gate oxide, and the channel width to length ratio of the n-channel FET, $\beta p$ is the product of the p-channel electron mobility, the capacitance per unit area of the p-channel FET's gate oxide, and the channel width to length ratio of the p-channel FET.

14. The power on reset circuit of claim 13 further comprising a pull-up resistor connected between said inverter output and said high power terminal to hold the power on reset signal inactive until the voltage across said high and low power terminals reaches a level that is sufficient to permit the p-channel FET of the CMOS inverter to drive the inverter output.

* * * * *